United States Patent [19]

Uwano

[11] 4,333,062
[45] Jun. 1, 1982

[54] TEMPERATURE STABILIZED MIC SOLID-STATE OSCILLATOR

[75] Inventor: Tomoki Uwano, Hirakata, Japan

[73] Assignee: Matsushita Electric Industrial Co., Ltd., Osaka, Japan

[21] Appl. No.: 107,616

[22] Filed: Dec. 27, 1979

[51] Int. Cl.³ .............................................. H03B 5/18
[52] U.S. Cl. .................................. 331/99; 331/117 D; 331/176
[58] Field of Search ...................... 331/96, 99, 107 SL, 331/117 D, 176

[56] References Cited

U.S. PATENT DOCUMENTS 4,187,476 2/1980 Shinkawa et al. .............. 331/176 X

OTHER PUBLICATIONS

Heywood, "Thick Film Oscillators in the 150–200 MHz Range with Thermostatic Control," Proceedings of Conference on Hybrid Microelectronics Canterbury, Kent, England, Sep. 25–27, 1973, pp. 201–207.

Primary Examiner—Siegfried H. Grimm
Attorney, Agent, or Firm—Wenderoth, Lind & Ponack

[57] ABSTRACT

A temperature-stabilized MIC solid state oscillator in the form of a planar transmission circuit has two strip line resonators respectively having chip capacitors inserted serially in the middle of the strip lines. Both of the chip capacitors have linear capacitance temperature characteristics. One strip line resonator operates as a band rejection filter and as a load circuit of an oscillating device. The other strip line resonator operates as a serial resonator to ground a port of the oscillating device that should be grounded. The oscillating frequency characteristics versus temperature are compensated in an excellent manner due to the provision of the two strip line resonators.

2 Claims, 6 Drawing Figures

TEMPERATURE STABILIZED MIC SOLID-STATE OSCILLATOR

BACKGROUND OF THE INVENTION

This invention relates to a solid state MIC (microwave integrated circuit) oscillator using a transistor, an FET or some other solid state device, which has a superior temperature stability, and can be applied to a pump signal source for a microwave down-converter. It is known that a Gunn diode, an Impatt diode, a transistor or an FET may be used as a microwave solid-state oscillation device. A resonator such as a half-wavelength microstrip line, a YIG resonator, or a dielectric resonator is used for the oscillator to set an oscillation frequency condition.

Generally, the oscillation frequency of the solid state oscillator depends on ambient temperature more or less, and therefore, a resonator must have a high external Q value (therefore high unloaded Q) and good temperature characteristics. Though a dielectric resonator is very suitable for a MIC solid state oscillator because it satisfies the needed characteristics mentioned above, the size of the resonator increases below the frequency of a few GHz, and electromagnetic coupling to microstrip line becomes loose.

These problems might be solved if the dielectric resonator of high Q, high temperature stability and high dielectric constant, such as a few hundred, were realized. However, it has not been realized yet.

On the other hand, temperature compensation using the package which packs the device chip and which consists of a dielectric material having a negative dielectric temperature constant has been proposed, but it restricts the package or chip type and lacks capability of general application. A half wavelength microstrip line resonator cannot be used when the temperature stabilization is needed because of low unloaded Q such as under 300, though it is very simple and easy to design. Further a half wavelength strip line resonator consisting of a metal film which is deposited by thick-film process involving screening through a mask has a lower unloaded Q such as 100, and is still unsuitable for an oscillator.

SUMMARY OF THE INVENTION

It is an object of this invention to provide a simple MIC solid state oscillator which has high temperature stability using microstrip line resonators having proper resonant frequency temperature characteristics, comprising: a first strip line resonator having a first chip capacitor having linear capacitance temperature variation characteristics inserted serially in the middle of said first strip line, the resonant frequency temperature coefficient of said first strip line resonator being provided continuously by position of said first chip capacitor, wherein said first strip line resonator is coupled electromagnetically to a strip transmission line connecting an oscillating device with a load circuit of an oscillator, and operates as a band rejection filter which is a load circuit of said oscillating device; and a second strip line resonator having a second chip capacitor having linear capacitance temperature variation characteristics inserted serially in the middle of said second strip line resonator, said second strip line resonator being a type of serial resonator in order to equivalently ground a port of said oscillating device which port is to be grounded for oscillating condition, whereby each of said two strip line resonators shares an effect of compensation in regard to oscillation frequency temperature characteristics of said oscillator so as to decrease variations of compensated oscillating frequency temperature characteristics caused by variations of said load and by variations of the characteristics of said oscillating device.

In accordance with this invention, a simple, highly temperature-stabilized and compact MIC oscillator is provided by merely using chip capacitors inserted in the middle of strip line resonators. In this invention, a half wavelength microstrip line resonator is used as a band stop filter which operates as a load circuit of an oscillating device, the resonant frequency of which controls the oscillation frequency mostly.

The unloaded Q of a half wavelength microstrip line resonator consisting of a metal film deposited by a thin film process involving vacuum evaporation and electroplating is about 300 and that fabricated by a thick film process is about 100. By using such low Q resonators, the oscillation frequency cannot be pulled fully enough to the resonant frequency of the resonator. So the idea is to compensate the oscillation frequency properly by providing a low Q resonator having specific temperature characteristics. More specifically, the idea is to insert a chip capacitor with temperature compensating characteristics serially in the middle of a strip line resonator.

The good point of this strip line resonator with a chip capacitor for temperature compensation is that the distribution of the electromagnetical field around the strip line resonator is not disturbed because of its physical feature, therefore it gives little influence to circuits nearby, and the strip line resonator which has the resonant frequency temperature characteristics continuously to an extent of some temperature coefficient can be realized by merely changing the position of the chip capacitor, which means easy circuit designing. Further, a port of the oscillating solid state device such as a transistor which is needed to be grounded at the oscillation frequency is connected by a strip line resonator which operates as a serial resonator and has a chip capacitor for temperature compensation inserted in the middle of the strip line resonator just similar to the strip line resonator mentioned above. By this strip line resonator, the temperature characteristics of the oscillation device itself can be compensated properly.

Using the above two temperature compensated strip line resonators and sharing the effect of the temperature compensation of the oscillation frequency, a highly temperature-stabilized oscillator even in regard to the variation of the device and the load characteristics can be provided even though the unloaded Q (hence external Q) of the strip line resonator is low.

If the metal film deposited by thick film process is used for MIC construction, the unloaded Q of the strip line resonator decreases still more, e.g. to 100, and the effect of this invention is more remarkable.

BRIEF DESCRIPTION OF THE DRAWINGS

This invention will be described in detail hereinafter with the aid of the accompanying drawings, in which.

Figure 1:
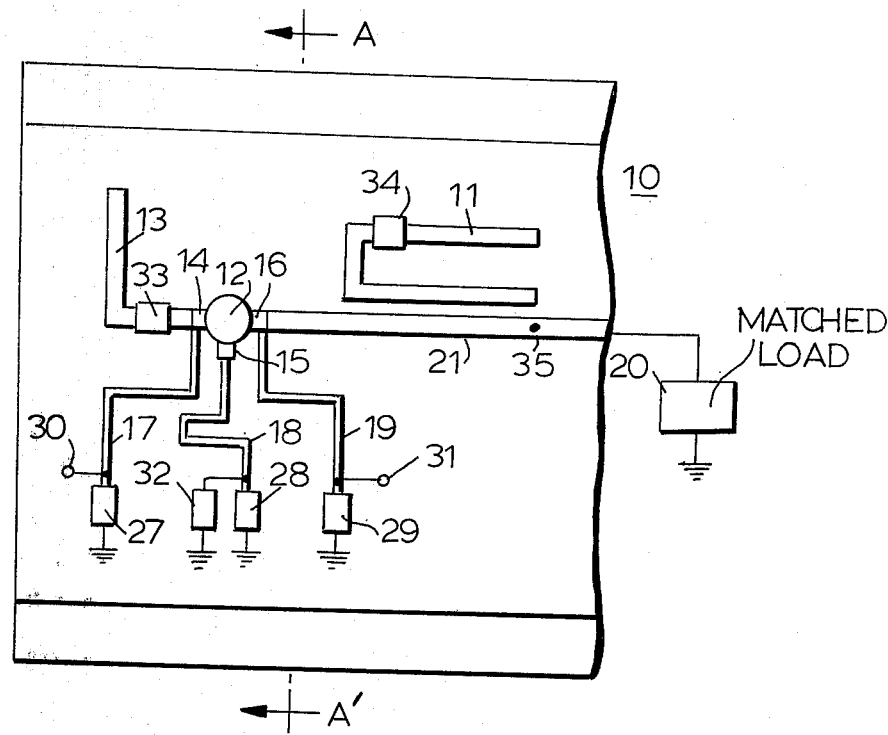
FIG. 1 is a schematic top plan view of an example of a temperature-stabilized MIC solid state oscillator in accordance with this invention.
Figure 2:
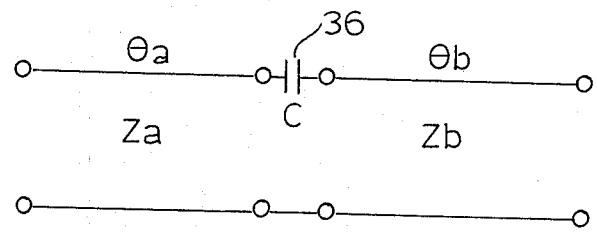
Figure 4:
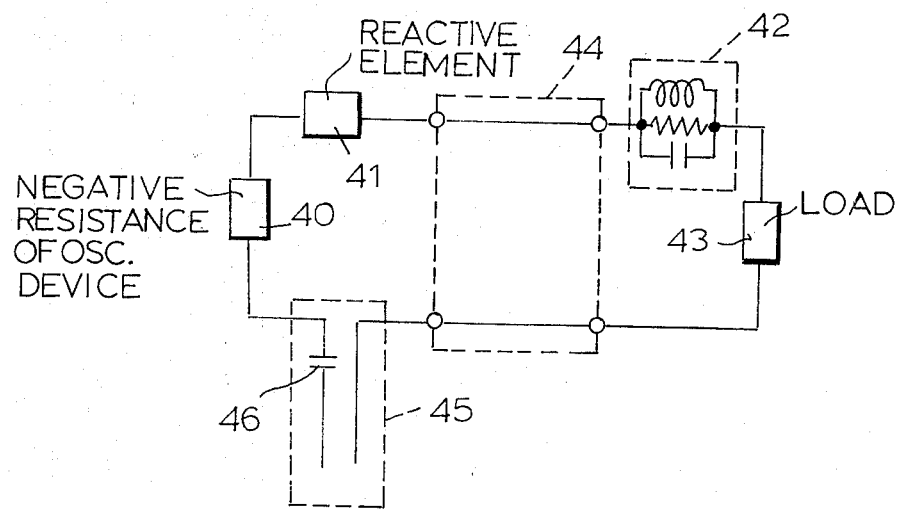
Figure 3:
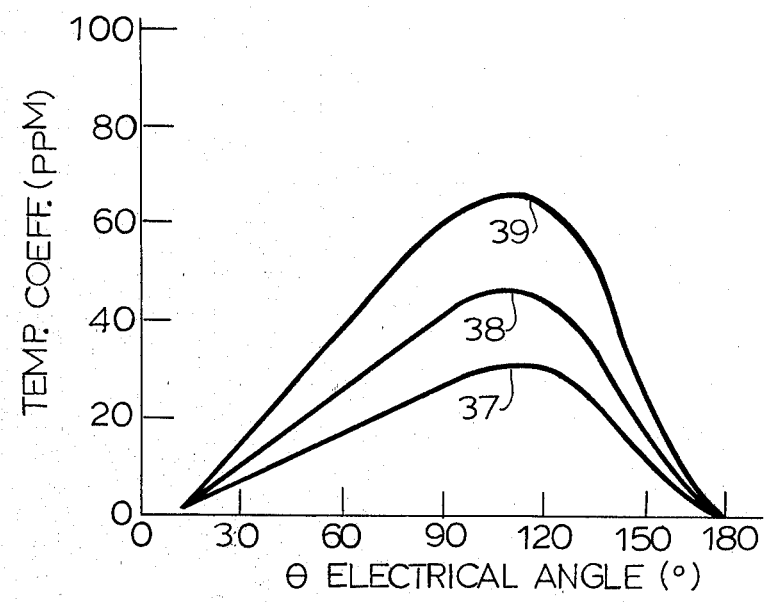
Figure 5:
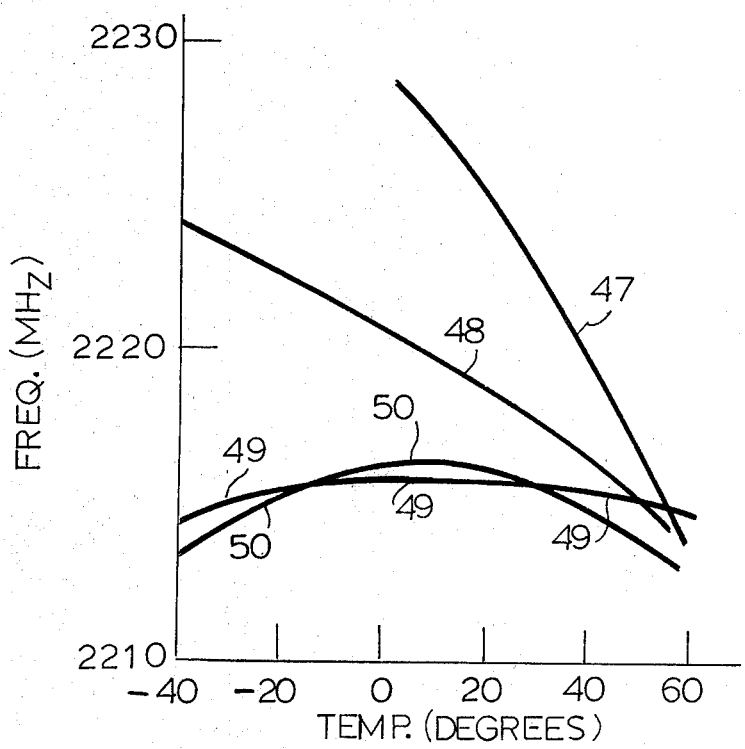

1 and additionally showing a shielding cover which can be used in conjunction of the oscillator;

FIG. 2 is an equivalent circuit for explaining the operation of the strip line resonator with a capacitor inserted;

FIG. 3 is a graph showing an example of temperature characteristics of the strip line resonator whose equivalent circuit is of FIG. 2;

FIG. 4 is an equivalent circuit for explaining the operation of the temperature-stabilized MIC solid state oscillator of FIG. 1; and FIG. 5 is a graph showing an oscillation frequency temperature characteristics of the oscillator of FIG. 1 and for explaining the temperature compensation of the oscillator and for explaining the features of this invention.

DESCRIPTION OF THE PREFERRED EMBODIMENT

Figure 1A:
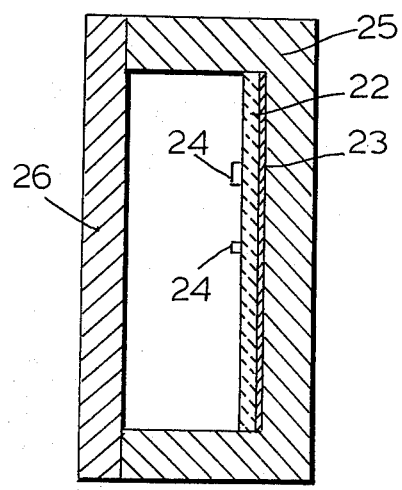
FIG. 1A is a schematic cross-sectional view of the oscillator of FIG. 1 taken along the line A—A' of FIG.

Referring to FIG. 1 and FIG. 1A, reference numeral 10 designates a transistor oscillator fabricated in the form of a planar circuit, the conductor pattern of which includes a first strip line resonator 11 operating as BRF (band rejection filter), a second strip line resonator 13 letting the base port 14 of the transistor 12 be equivalently grounded at the oscillation frequency, three one-quarter-wavelength strip lines 17, 18, 19, connected to the base 14, emitter 15 and collector 16 of the transistor 12, respectively, for supplying a dc bias and a microstrip transmission line 21 connecting the collector port 16 with a matched-load 20 through BRF.

These figures show a microstrip type of planar transmission line having a dielectric substrate 22 having a conductive ground layer 23 provided on the bottom surface thereof and a conductive pattern 24 deposited on the front surface thereof parallel to the ground layer 23. The conductor pattern can be deposited by conventional thin-film process involving evaporation and electroplating method or by thick-film process involving screening through a mask. In the cross-section of the oscillator shown, this conductor pattern 24 consists of the strip lines 19 and 21. Other elements shown in FIG. 1 are also included in the conductor pattern.

The microstrip line can be enclosed in a conductive shield conveniently formed by two separable portions. The first portion forms a channel 25, on an internal surface of which the ground layer 23 is provided and the side walls of which define the width of the channel. The other portion, which forms a cover 26, mates with the channel 25 by conventional means to complete the enclosure and form a rectangular cross section. The shield is not always necessary for operation of the invention, but microstrip line circuits are conveniently enclosed by such a shield to prevent radiation of energy. Accordingly, the channel 25 and the cover 26 are included in the interest of completeness.

Strip lines 17, 18, 19 have high characteristic impedances and are about a quarter-wavelength at the oscillation frequency; one side of each strip line is respectively bypassed by capacitors 27, 28, 29 and therefore the lines are grounded at the oscillation frequency. The impedances at the opposite sides of the strip line 17, 18, 19 where they are connected to the transistor ports 14, 15, 16, are accordingly very high, and these strip lines 17, 18, 19 cause little influence on the oscillation. A DC bias is supplied to the base 14 and the collector 16 of the transistor 12 through a port 30 and a port 31. A resistor 32 is used for stabilizing the emitter DC current.

The strip line resonator 13 connected to the base 14 lets the base 14 be equivalently grounded at the oscillation frequency, and a second chip capacitor 33 for temperature compensation having linear capacitance variation temperature characteristics is serially inserted in the middle of the strip line resonator 13. If the impedance of the capacitor 33 is low enough at the oscillation frequency, the length of the strip line 13 from the base 14 to the opposite side of the strip line might be a quarter-wavelength in order to let the base 14 be grounded. In accordance with an increase of the impedance of the capacitor 33, the length of the strip line 13 is adjusted by lengthening it.

Under these conditions, if the proper load circuit is connected to the collector port 16, this circuit oscillates by the feedback network including the internal capacitance $C_{ce}$ between the collector and the emitter of the transistor 12 and the capacitance $C_{eb}$ between the emitter and the ground as a Colpits type oscillator. In FIG. 1, the load circuit viewed from the collector 16 is a BRF including the first strip line resonator 11 which is coupled to the microstrip transmission line 21 which connects the collector port 16 and the matched load 20.

In the middle of the strip line resonator 11, a first chip capacitor 34 is serially inserted for temperature compensation, the characteristics of which are similar to those of the second chip capacitor 33. If the capacitance of the capacitor 34 is large enough and so the impedance of the capacitor 34 is low enough at the oscillation frequency, the length of the strip line resonator 11 becomes a half-wavelength. In accordance with a decrease of the capacitance of the capacitor 34, hence an increase of the impedance of the capacitor 34, the length of the strip line resonator 11 is adjusted by lengthening it. So the total length of the strip line resonator 11 is generally longer than a half wavelength, but the electrical operation is equivalent to that of a half wavelength strip line resonator.

The amount of coupling between the strip line resonator 11 and the transmission line 21 is dependent on the gap width between the two. By adjusting the load circuit of the transistor by varying the coupling factor and varying the length between the collector port 16 and the coupling point 35 where the strip line resonator 11 is equivalently coupled to the microstrip transmission line 21, the oscillational condition of the oscillator 10 is provided.

FIG. 2 illustrates an equivalent circuit of the strip line resonator 11. Referring to FIG. 2, a capacitor 36 of capacitance C is serially inserted between two transmission lines having characteristic impedance Za, Zb and electrical angle $\theta_a$, $\theta_b$, respectively.

The resonant condition of the circuit shown in FIG. 2 is given by the following equation:

$$Z_a \cot \theta_a + (1/\omega c) = -Z_b \cot \theta_b$$

where $\omega = 2\pi f$, f is the frequency, $\theta_{a,b} = (\omega/v)l_{a,b}$, v is the propagation velocity and $l_{a,b}$ is the strip line physical length. By solving the equation, f is derived as the resonant frequency. If the capacitor 36 has temperature characteristics such that the capacitance varies in accordance with temperature variations, the resonant frequency f varies in accordance with the temperature variations. A rate of the resonant frequency variation versus temperature is given by differentiating the equation above.

FIG. 3 illustrates a resonant frequency temperature coefficient characteristics versus an electrical angle θ between one edge of the strip line resonator and the position where the capacitor is inserted. Characteristic curves 37, 38, 39 are obtained when the capacitors have 220 ppM/°C., 330 ppM/°C. and 470 ppM/°C. temperature capacitance coefficients, respectively. The characteristic curves of FIG. 3 are exemplary ones when the capacitance at room temperature is 2 pF, and the resonant frequency of the strip line resonator with the 2 pF capacitor inserted is about 2 GHz.

Referring to FIG. 3, the resonant frequency temperature coefficient varies continuously by varying the capacitor insertion position (electrical angle θ), and using these three kinds of standard capacitors for temperature compensation. A strip line resonator of a half wavelength type having an arbitrary resonant frequency temperature coefficient to the extent of 65 ppM is easily designed by merely the combination of the position of the capacitor and the choice of the standard capacitor for temperature compensation.

In FIG. 1, the strip line resonator 13, one side of which is connected to the base port 14 and having the chip capacitor 33 attached thereto for temperature compensation, operates in a similar manner to the strip line resonator 11 mentioned above, with respect to its resonant frequency temperature characteristics. These two strip line resonators 11, 13 compensate the oscillation frequency temperature characteristics of the oscillator 10. FIG. 4 illustrates an equivalent circuit of the oscillator 10. In FIG. 4, reference numeral 40 designates a negative resistance of the oscillation device (transistor). Reference numeral 41 designates an equivalent reactive element including an inductance of the bonding wire in the transistor package, a capacitance $C_{ob}$ between the base and the collector and a portion of the microstrip transmission line 21, and it resonates as a series resonant circuit at the oscillation frequency. An external Q value of the resonant circuit 41 is generally low, e.g. under 20.

Reference numeral 42 designates an equivalent circuit of the strip line resonator 11 coupled to the transmission line 21 and operating as a BRF, and it is shown as a parallel resonant circuit inserted serially at the equivalent coupling position 35. A load 43 is the same as the load 20. A transmission line 44, having a quarter wavelength from the coupling point 35 toward the transistor along the strip line 21, operates as an impedance inverter. Reference numeral 45 designates the strip line resonator 13, with a capacitor 45 being inserted. The resonator 45 resonates as a series resonant circuit at the oscillation frequency.

FIG. 5 is a graph showing the oscillation frequency characteristics versus temperature of the oscillator 10 and showing the process of temperature compensation by this invention. Characteristic curve 47 is obtained when neither chip capacitor 33 nor 34 has capacitance temperature characteristics. Large variations of the characteristics of the curve 47 are due to the temperature impedance variation of the reactance element 41 which includes the base-collector capacitance $C_{ob}$ which has very sensitive capacitance variation with temperature. This $C_{ob}$ value increases in accordance with an increase of the temperature.

Characteristic curve 48 is obtained when the chip capacitor 33 has negative temperature characteristics and the chip capacitor 34 has no temperature characteristics. In this case, the serial resonator 45 has positive resonant frequency temperature characteristics and compensates for a portion of the reactance variations of the reactance element 41.

Furthermore, when the chip capacitor 34 has negative capacitance temperature characteristics, the oscillation frequency characteristics are improved as shown by characteristic curve 49.

It is desirable that the oscillation frequency characteristic curve is compensated as much as possible. However, the temperature impedance variation of the reactance element 41 (that is, $C_{ob}$) is comparatively large, and a chip capacitor having a large temperature capacitance coefficient with stable quality is not always available easily and cheaply.

Sharing the effect of temperature compensation by two strip line resonators with temperature resonant frequency characteristics, the variations of the compensated oscillation frequency characteristics caused by variations of transistor characteristics (including element 41) and by variations of the load 43 are decreased.

Characteristic curve 50 is obtained when only the chip capacitor 34 has temperature characteristics and the chip capacitor 33 has no temperature characteristics and hence the oscillation frequency is compensated only by strip line resonator 11. The deviation of the characteristics of the curve 50 is greater than that of characteristic curve 49. In this case, variations of the characteristics caused by variations of the load increase.

What is claimed is:

1. A temperature-stabilized MIC solid-state oscillator fabricated in the form of a planar transmission circuit and comprising:

a first strip line resonator having a first chip capacitor having linear capacitance temperature variation characteristics inserted serially in the middle of said first strip line, the resonant frequency temperature coefficient of said first strip line resonator being provided continuously by position of said first chip capacitor, wherein said first strip line resonator is coupled electromagnetically to a strip transmission line connecting an oscillating device with a load circuit of an oscillator, and operates as a band rejection filter and which is a load circuit of said oscillating device; and a second strip line resonator having a second chip capacitor having linear capacitance temperature variation characteristics inserted serially in the middle of said second strip line resonator, said second strip line resonator being a type of serial resonator in order to equivalently ground a port of said oscillating device which is to be grounded for an oscillating condition, whereby each of said two strip line resonators shares an effect of compensation in regard to oscillation frequency temperature characteristics of said oscillator so as to decrease variations of compensated oscillating frequency temperature characteristics caused by variations of said load and caused by variations of characteristics of said oscillating device.

2. A temperature-stabilized MIC solid-state oscillator as claimed in claim 1, wherein the planar transmission circuit including said strip line resonators is formed by a metal-film deposited by thick-film process involving screening through a mask.

* * * * *